United States Patent
Yoon et al.

(10) Patent No.: US 9,494,621 B2
(45) Date of Patent: Nov. 15, 2016

(54) INTERFERENCE COMPENSATING SINGLE POINT DETECTING CURRENT SENSOR FOR A MULTIPLEX BUSBAR

(71) Applicant: RETIGRID CO., LTD., Seoul (KR)

(72) Inventors: Jong Chan Yoon, Busan (KR); Young Ho Ahn, Seoul (KR)

(73) Assignee: RETIGRID CO., LTD., Seoul (KR)

( * ) Notice: Subject to any disclaimer, the term of this patent is extended or adjusted under 35 U.S.C. 154(b) by 0 days.

(21) Appl. No.: 14/404,256

(22) PCT Filed: Mar. 25, 2014

(86) PCT No.: PCT/KR2014/002529
§ 371 (c)(1),
(2) Date: Nov. 26, 2014

(87) PCT Pub. No.: WO2014/163318
PCT Pub. Date: Oct. 9, 2014

(65) Prior Publication Data
US 2016/0011239 A1  Jan. 14, 2016

(30) Foreign Application Priority Data
Apr. 4, 2013  (KR) .......... 10-2013-0037123

(51) Int. Cl.
| | |
|---|---|
| *G01R 1/20* | (2006.01) |
| *G01R 19/00* | (2006.01) |
| *G01R 33/07* | (2006.01) |
| *G01R 15/20* | (2006.01) |

(52) U.S. Cl.
CPC .......... *G01R 19/0046* (2013.01); *G01R 15/20* (2013.01); *G01R 15/207* (2013.01); *G01R 33/07* (2013.01)

(58) Field of Classification Search
CPC . G01R 1/203; G01R 15/146; G01R 19/0007
See application file for complete search history.

(56) References Cited

U.S. PATENT DOCUMENTS

| | | | |
|---|---|---|---|
| 2007/0176599 A1* | 8/2007 | Funato | ............... G01R 33/10 324/260 |
| 2013/0099775 A1* | 4/2013 | Mitsuya | ............... G01R 15/207 324/126 |

FOREIGN PATENT DOCUMENTS

| | | |
|---|---|---|
| JP | 2001066329 | 3/2001 |
| JP | 2002333456 | 11/2002 |
| KR | 1020060050942 | 5/2006 |
| KR | 101227653 | 1/2013 |

* cited by examiner

*Primary Examiner* — Tung X Nguyen
(74) *Attorney, Agent, or Firm* — IPLA P.A.; James E. Bame

(57) ABSTRACT

A single point detecting current sensor includes a plurality of magnetic sensor modules, wherein a magnetic sensor module is installed onto each busbars with an insulation displacement contact or is installed adjacent to each busbar, and outputs the current through a busbars measured by a magnetic sensor; a signal collection module collecting measured signals output by the plurality of magnetic sensor modules; and a signal interference compensation module deriving a corrected current value for which interference has been removed, by calculating the mutual interference between said busbars using the signals collected by said signal collection module.

8 Claims, 6 Drawing Sheets

INTERFERENCE COMPENSATING SINGLE POINT DETECTING CURRENT SENSOR FOR A MULTIPLEX BUSBAR

BACKGROUND

The present invention relates to a single point detection current sensor and, more particularly, to an interference correction type single-point detection current sensor for multiple busbars.

A method of measuring the amount of current in a contactless way in a panel board and a switch board includes a method using a current transformer and a method using a magnetic sensor. A method using a circular core as in a current transformer is a method of measuring the amount of current through induced electromotive force according to an induced magnetic flux that is formed in the core itself. Such a method has relatively small interference with other power lines, but requires a great installation space because an induced magnetic flux is formed while circulating the core. Furthermore, such a method is vulnerable to a mechanical deformation attributable to vibration or a mechanical shock and has a safety problem in installation and between control systems in an environment in which insulation has not been provided as in a busbar.

In contrast, the magnetic sensor method is a method of disposing sensors capable of measuring a magnetic flux, such as hall sensors, on the periphery of busbars, directly measuring the amount of a magnetic flux, and converting the measured amount into the amount of current (refer to Korean Patent Application Nos. 10-2009-0075419 and 10-2012-0028306). A single-point detection type current sensor for obtaining information about current that flows at a single point location of wire or a busbar using a magnetic sensor as described above is advantageous in that the installation of equipment is easy, but has a problem in that the sensor itself is greatly influenced by environments, such as a temperature and the distance, and a problem in that an error of a measured value is severely generated due to severe interference between lines in an environment in which multiple busbars connected to a high-power load are concentrated.

The inventor of the present invention has developed a current sensor having improved measurement accuracy by removing interference occurring between busbars while maintaining the advantage of the magnetic sensor method in order to measure the amount of current in an environment in which a plurality of busbars is concentrated (multiple busbars).

SUMMARY OF THE INVENTION

The present invention has been proposed in order to solve the above problems of the existing proposed methods, and an object of the present invention is to provide an interference correction type single-point detection current sensor for multiple busbars, which does not have interference between lines and has significantly improved accuracy in measuring the amount of current by including a signal interference correction module for deriving corrected current values from which interference has been removed by calculating the amounts of interference between a plurality of busbars.

Another object of the present invention is to provide an interference correction type single-point detection current sensor for multiple busbars, wherein the signal interference correction module is configured to include an interference coefficient matrix generation unit, an interference coefficient derivation unit, and a correction current value calculation unit, thereby being capable of deriving a corrected current value from which interference is simply removed based on an interference coefficient matrix and calculation.

Yet another object of the present invention is to provide an interference correction type single-point detection current sensor for multiple busbars, wherein a plurality of interference coefficient matrices is generated according to a temperature, the amount of current, the location where current is measured, and the distance between busbars, the plurality of generated interference coefficient matrices is stored, and an interference coefficient matrix suitable for a corresponding temperature, amount of current, and distance is used, thereby minimizing the occurrence of an error attributable to various variables.

An interference correction type single-point detection current sensor for multiple busbars according to an aspect of the present invention for accomplishing the above objects includes a plurality of magnetic sensor modules which are brought in insulation contact with or installed adjacent to a plurality of respective busbars, measure currents flowing into the busbars using magnetic sensors, and output the measured currents; a signal collection module which collects the measured signals output by the plurality of magnetic sensor modules; and a signal interference correction module which derives corrected current values from which interference has been removed by calculating the amounts of interference between the plurality of busbars in the signals collected by the signal collection module.

Preferably, the magnetic sensor module may be configured to include the magnetic sensor which is brought in insulation contact with or installed adjacent to the busbar and collects a magnetic field line generated by a current flowing into the busbar and a signal analysis circuit which calculates back to information about a current that flows into the busbar by analyzing a signal collected by the magnetic sensor.

Preferably, the signal interference correction module may be configured to include an interference coefficient matrix generation unit which generates an interference coefficient matrix; an interference coefficient derivation unit which derives the interference coefficient of a corresponding busbar using the interference coefficient matrix or an interpolation method; and a correction current value calculation unit which derives the corrected current value using the derived corresponding interference coefficient.

More preferably, the signal interference correction module may further include interference correction memory which stores an interference correction equation for deriving the corrected current value using the interference coefficient matrix generated by the interference coefficient matrix generation unit and the interference coefficient. The interference coefficient derivation unit and the correction current value calculation unit may read a value necessary to correct the interference of the measured signal from the interference correction memory and calculate the corrected current value.

More preferably, a plurality of the interference coefficient matrices may be generated in each predetermined unit within a predetermined range of one or more variables selected from a group including a temperature, current, and measured location, and distance between the busbars.

Preferably, the interference coefficient matrix may be modeled and generated according to the following equation.

$$B = \frac{u_0 I}{4\Pi} \int \frac{dl \times r^\wedge}{r^2} = \frac{u_0 I}{4\Pi} \cdot \frac{1}{r} \quad \text{[Equation]}$$

(wherein B=a magnetic flux density, $u_0$=permeability in vacuum, I=current, r=a distance from a conductor (a distance from the busbar or an adjacent busbar), dl=a curvilinear integral of a current direction, and r̂=a unit vector in a direction r)

Preferably, the single-point detection current sensor may further include a temperature measurement module. A plurality of interference coefficient matrices may be generated in each predetermined unit within a predetermined temperature range, and the signal interference correction module may derive the corrected current value using the interference coefficient matrix that complies with a temperature measured by the temperature measurement module.

Preferably, the single-point detection current sensor may further include a measurement error correction module which derives the measurement error correction value of each sensor by calculating environment variables, including a temperature, distance from the busbar, and intensity of a magnetic flux in the measured signal output by the magnetic sensor module. The signal interference correction module may derive the corrected current value based on the measurement error correction value derived by the measurement error correction module.

In accordance with the interference correction type single-point detection current sensor for multiple busbars proposed by the present invention, since the signal interference correction module for deriving corrected current values from which interference has been removed by calculating the amounts of interference between a plurality of busbars is included, interference between lines is removed, and accuracy in measuring the amount of current is significantly improved.

Furthermore, in accordance with the present invention, a corrected current value from which interference is simply removed can be derived based on an interference coefficient matrix and calculation because the signal interference correction module is configured to include an interference coefficient matrix generation unit, an interference coefficient derivation unit, and a correction current value calculation unit.

Furthermore, in accordance with the present invention, the occurrence of an error attributable to various variables can be minimized because a plurality of interference coefficient matrices is generated according to a temperature, the amount of current, the location where current is measured, and the distance between busbars, the plurality of generated interference coefficient matrices is stored, and an interference coefficient matrix suitable for a corresponding temperature, amount of current, and distance is used.

DETAILED DESCRIPTION OF THE INVENTION

Figure 1:
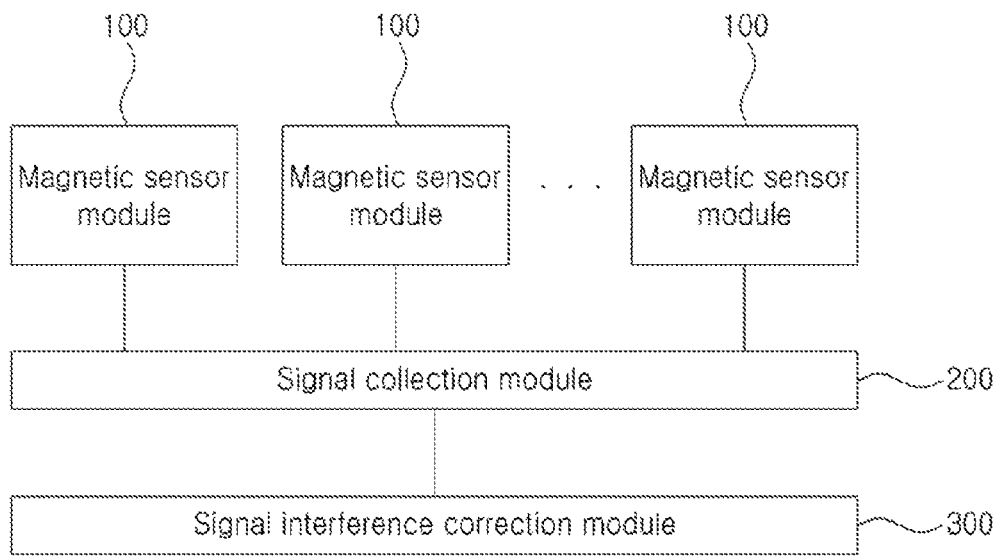
FIG. 1 is a diagram illustrating the configuration of an interference correction type single-point detection current sensor for multiple busbars in accordance with an embodiment of the present invention.

Hereinafter, preferred embodiments are described in detail with reference to the accompanying drawings so that those skilled in the art to which the present invention pertains may easily practice the present invention. In this case, in describing the preferred embodiments of the present invention in detail, a detailed description of the known functions or elements will be omitted if it is deemed to make the gist of the present invention unnecessarily vague. Furthermore, the same reference numerals designate elements having similar functions and operations throughout the drawings.

In addition, throughout the specification, when it is described that one element is 'connected' to the other element, the one element may be 'directly connected' to the other element or 'indirectly connected' to the other element through another element. Furthermore, when it is described that one element 'includes' another element, it means that the one element does not exclude another element, but may include other elements, unless otherwise described.

Figure 2:
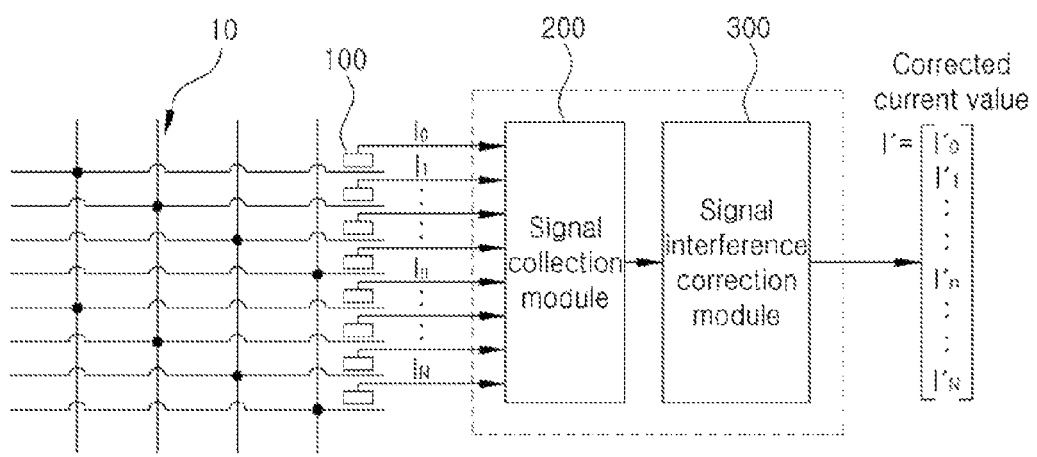
FIG. 2 is a diagram illustrating a process of measuring current through the interference correction type single-point detection current sensor for multiple busbars in accordance with an embodiment of the present invention.

FIG. 1 is a diagram illustrating the configuration of an interference correction type single-point detection current sensor for multiple busbars in accordance with an embodiment of the present invention, and FIG. 2 is a diagram illustrating a process of measuring current through the interference correction type single-point detection current sensor for multiple busbars in accordance with an embodiment of the present invention. As illustrated in FIG. 1, the interference correction type single-point detection current sensor for multiple busbars in accordance with an embodiment of the present invention may be configured to include magnetic sensor modules 100, a signal collection module 200, and a signal interference correction module 300. More specifically, in the interference correction type single-point detection current sensor for multiple busbars in accordance with an embodiment of the present invention, as illustrated in FIG. 2, the N magnetic sensor modules 100 installed adjacent to respective N busbars 10 may measure the amounts of current $I_0, I_1, \ldots, I_n, \ldots, I_N$ in their respective locations. The signal collection module 200 may collect the measured amounts (measured signals) and transfer the collected amounts to the signal interference correction module 300. The signal interference correction module 300 may derive corrected current values $I'_0, I'_1, \ldots, I'_n, \ldots, I'_N$ from which interference has been removed by calculating the amount of interference between the busbars. Each of the elements of the single-point detection current sensor proposed by the present invention is described below.

Figure 3:
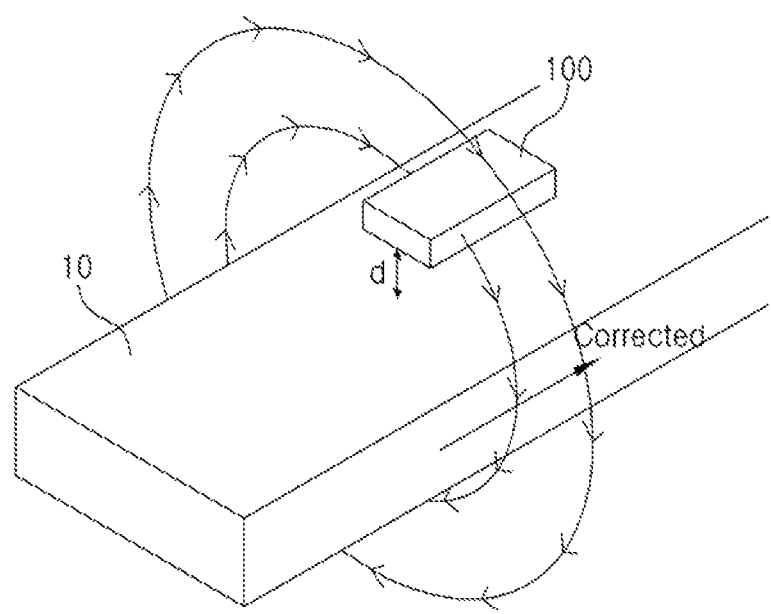
FIG. 3 is a diagram illustrating the current measurement method of a magnetic sensor module in the interference correction type single-point detection current sensor for multiple busbars in accordance with an embodiment of the present invention.

The magnetic sensor modules 100 are brought in insulation contact with or installed adjacent to the plurality of respective busbars 10, and they may measure currents flowing into the busbars 10 using magnetic sensors and output the measured currents. Since the magnetic sensor modules 100 are installed in the respective busbars, the magnetic sensor modules 100 and the busbars 10 may be configured to have the same number. The magnetic sensor modules 100 may function to convert magnetic field lines, generated by currents flowing into the multiple busbars 10, into electrical signals. FIG. 3 is a diagram illustrating the current measurement method of the magnetic sensor module in the interference correction type single-point detection current sensor for multiple busbars in accordance with an embodiment of the present invention. As illustrated in FIG. 3, when current flows into the busbar 10, a magnetic field line is formed according to the right-handed screw rule. The magnetic sensor module 100 may convert the magnetic field line into an electrical signal and measure current flowing into the busbar 10.

In accordance with an embodiment of the present invention, the magnetic sensor module 100 may be configured to include a magnetic sensor which is brought in insulation contact with or installed adjacent to the busbar 10 and which collects a magnetic field line generated by current flowing into the busbar 10 and a signal analysis circuit which interprets a signal collected by the magnetic sensor and calculates back to information about current that flows into the busbar 10. The magnetic sensor may use a hall sensor, but is not limited thereto. Various sensors may be used as the magnetic sensor.

Figure 4:
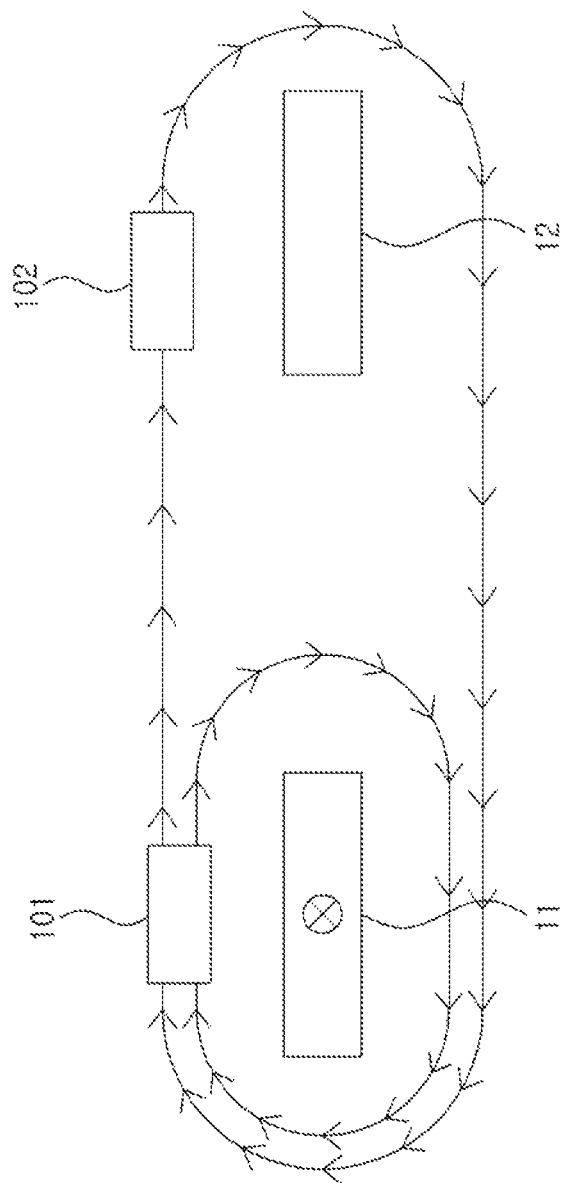
FIG. 4 is a diagram illustrating a case where interference is generated due to current that flows into a busbar adjacent to a single busbar in the interference correction type single-point detection current sensor for multiple busbars in accordance with an embodiment of the present invention.

FIG. 4 is a diagram illustrating a case where interference is generated due to current that flows into a busbar adjacent to a single busbar in the interference correction type single-point detection current sensor for multiple busbars in accordance with an embodiment of the present invention. As illustrated in FIG. 4, if several busbars 10 are disposed as in a common switch board or panel board environment, a magnetic sensor module 101 mounted on a busbar 11 whose amount of current is to be measured is also influenced by a magnetic field that is subject to interference attributable to current flowing into an adjacent busbar 12 in addition to current flowing into the corresponding busbar 11. This may be a further serious problem if the distance between the busbars 10 is close, if current flowing into an adjacent busbar is strong, or if perfect shielding is difficult due to a problem, such as the discharging of high voltage. Furthermore, although physical shielding is performed, a certain amount of an interference phenomenon is generated because a leaking magnetic field is not perfectly shielded. In order to solve such a problem, the inventor of the present invention proposes that an accurately corrected current value from which interference has been removed can be derived using an interference coefficient, formulated or modeled from a previously measured value, in a measured signal measured by each busbar 10 by including the signal collection module 200 and the signal interference correction module 300.

The signal collection module 200 may function to collect measured signals output by the plurality of magnetic sensor modules 100 and transfer the collected signals to the signal interference correction module 300.

The signal interference correction module 300 may derive corrected current values from which interference has been removed by calculating the amounts of interference between the plurality of busbars 10 in the signal collected by the signal collection module 300.

Figure 5:
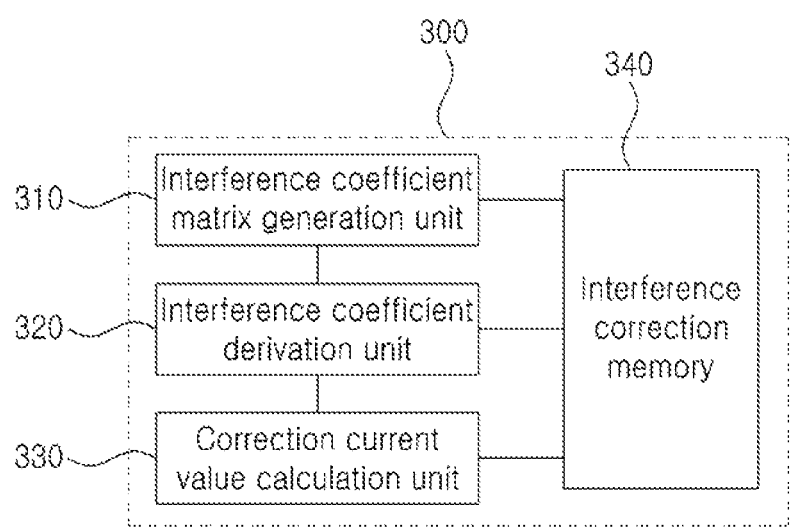
FIG. 5 is a diagram illustrating a detailed configuration of a signal interference correction module in the interference correction type single-point detection current sensor for multiple busbars in accordance with an embodiment of the present invention.

FIG. 5 is a diagram illustrating a detailed configuration of a signal interference correction module in the interference correction type single-point detection current sensor for multiple busbars in accordance with an embodiment of the present invention. As illustrated in FIG. 5, the signal interference correction module 300 of the interference correction type single-point detection current sensor for multiple busbars in accordance with an embodiment of the present invention may be configured to further include an interference coefficient matrix generation unit 310, an interference coefficient derivation unit 320, and a correction current value calculation unit 330. In some embodiments the signal interference correction module 300 may be configured to include interference correction memory 340.

Figure 6:
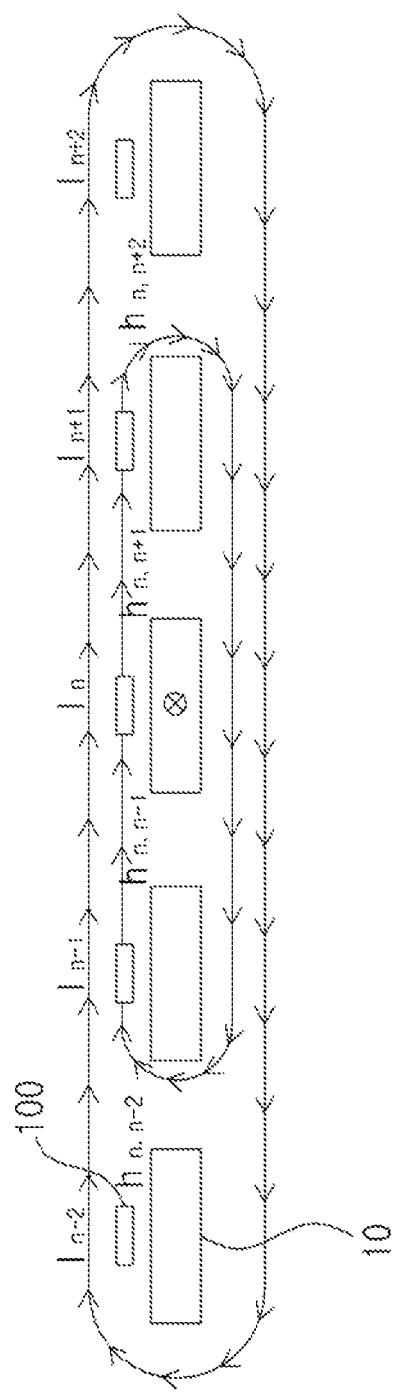
FIG. 6 is a diagram illustrating a structure for modeling an interference equation in the interference correction type single-point detection current sensor for multiple busbars in accordance with an embodiment of the present invention.

The interference coefficient matrix generation unit 310 may generate an interference coefficient matrix. The interference coefficient may be represented by $h_{n,m}$, which means the amount of current that flows into an $n^{th}$ busbar 10 and that interferes with an $m^{th}$ busbar 10. FIG. 6 is a diagram illustrating a structure for modeling an interference equation in the interference correction type single-point detection current sensor for multiple busbars in accordance with an embodiment of the present invention. As illustrated in FIG. 6, the amount of interference current measured by an $(n+1)^{th}$ magnetic sensor modules 100 due to current $I'_n$ actually flowing into the $n^{th}$ busbar 10 may be represented by $h_{n,n+1}*I'_n$. Accordingly, current In measured by the $n^{th}$ busbar 10 may be represented by the amounts of interference current $h_{0,n}*I'_0 + h_{1,n}*I'_1 + h_{2,n}*I'_2 \ldots$ based on the amount of current I'n actually flowing into the $n^{th}$ busbar 10 and the amounts of current $I'_0$, $I'_1$, $I'_{n-1}$, and $I'_{n+1}$ flowing into adjacent busbars 10.

Assuming that a matrix indicative of current actually flowing into each busbar 10 is I' and a matrix indicative of current measured by the magnetic sensor modules 100 is I, a measured current I may be equal to H*I' (a value obtained by multiplying actual current by an interference coefficient) according to an interference coefficient matrix H (refer to Equation 1 and a matrix below). That is, the measured current I may be considered to be a value influenced by interference attributable to the actual current I' that flows into the adjacent busbars 10. The interference coefficient matrix H may be defined in a table form by measuring a temperature and the distance through experiments. If H is the function of I', that is, if H is influenced by I', I' may be calculated as a converging value by repeatedly calculating $I=H^{-1}*I$ and obtaining H after obtaining h in the state in which the initial value of I' is set to I.

$$I = H * I' \begin{cases} I: \text{ a measurement current matrix,} \\ H: \text{ an interference coefficient matrix,} \\ I': \text{ an actual current matrix} \end{cases} \quad \text{Equation 1}$$

$$\begin{bmatrix} I_0 \\ I_1 \\ \cdot \\ \cdot \\ \cdot \\ I_n \\ \cdot \\ \cdot \\ \cdot \\ I_N \end{bmatrix} = \begin{bmatrix} h_{0,0} & h_{1,0} & h_{2,0} & \ldots & h_{n,0} & \ldots & h_{N,0} \\ h_{0,1} & h_{1,1} & h_{2,1} & \ldots & h_{n,1} & \ldots & h_{N,1} \\ \cdot & \cdot & \cdot & & \cdot & & \cdot \\ \cdot & \cdot & \cdot & & \cdot & & \cdot \\ \cdot & \cdot & \cdot & & \cdot & & \cdot \\ h_{0,n} & h_{1,n} & h_{2,n} & \ldots & h_{n,n} & \ldots & h_{N,n} \\ \cdot & \cdot & \cdot & & \cdot & & \cdot \\ \cdot & \cdot & \cdot & & \cdot & & \cdot \\ \cdot & \cdot & \cdot & & \cdot & & \cdot \\ h_{0,N} & h_{1,N} & h_{2,N} & \ldots & h_{n,N} & \ldots & h_{N,N} \end{bmatrix} \begin{bmatrix} I'_0 \\ I'_1 \\ \cdot \\ \cdot \\ \cdot \\ I'_n \\ \cdot \\ \cdot \\ \cdot \\ I'_N \end{bmatrix}$$

$h_{00}$, $h_{11}$, $h_{22}$, and $h_{NN}$ denote ratios of the busbars 10 to be measured which are influenced by the respective busbars 10 and each may be 1, but may not be 1 depending on variables, such as a temperature, the amount of current, and the distance. The aforementioned interference coefficient matrix may be derived in an equation form according to the physical shape of the busbars 10 and the magnetic sensor modules 100 or may be derived by measurement in an actual environment. Furthermore, the aforementioned interference coefficient matrix may be featured according to environment variables, such as a temperature, the distance from a busbar, and the intensity of a magnetic flux, and a value in an environment in which measurement is not performed may be estimated through an interpolation method.

Experimentally, if current is made sequentially flow into the busbars and measured, when current of 1 A flows into only a No. 1 busbar 10, that is, if an actual current (I') matrix is $$I' \text{ (actual current)} = \begin{bmatrix} 0 \\ 1 \\ 0 \\ \cdot \\ \cdot \\ \cdot \\ 0 \end{bmatrix},$$

a measured current $I_0$ in a No. 0 busbar is $I_0 = h_{0,0}*I'_0 + h_{1,0}*I'_1 + h_{2,0}*I'_2 + \ldots + h_{n,0}*I'_n + \ldots + h_{N,0}*I'_N$.

(In this case, I=current measured by the magnetic sensor module, $h_{n,m}$=an interference coefficient of current that flows into the $n^{th}$ busbar and that interferes with the $m^{th}$ busbar, I'=actual current, n=order of a busbar to be measured)

If the actual current is substituted in the measured current, $I_0 = h_{1,0}*I'_1$. That is, if current of 0.1 A is measured in the No. 0 busbar 10 when an actual current of 1 A flows into the No. 1 busbar 10, the No. 0 busbar 10 is subject to interference of 10% due to the No. 1 busbar 10. In this case, an interference coefficient $h_{1,0}$ becomes 0.1.

Meanwhile, although the busbars 10 are assumed to be very regularly installed, such an interference coefficient has a basic physical difference attributable to the distance between the busbars 10 and the distance between the magnetic sensor module 100 and the busbar 10. Accordingly, an interference coefficient needs to be calculated in each of the regularly configured busbars 10.

Meanwhile, the interference coefficient may differ depending on a temperature, the intensity of a magnetic flux (the amount of current), and the distance between a measured location and the busbar 10. Preferably, a plurality of the interference coefficient matrices may be generated in each predetermined unit within a predetermined range of one or more variables selected from the group consisting of a temperature, the amount of current, and the distance between a measured location and the busbar 10. The plurality of generated interference coefficient matrices may be stored in the interference correction memory 340 or another separate memory.

That is, the interference coefficient may be measured based on a temperature and the intensity of a magnetic flux. The amount of physical interference is proportional to the amount of current, but may be different depending on the arrangement of busbars and a degree that interference is shielded. The matrix H according to a temperature and the amount of current may be derived by measuring the interference coefficient using a different amount of current for each temperature in the aforementioned experiments, and a coefficient may be extracted using an interpolation method with respect to a required part and may be used. Accordingly, a plurality of the matrices H may be present with respect to a temperature value and a current value.

Input for selecting the actual coefficient includes a temperature and the intensity of current. Reference may be made to a coefficient corresponding to a temperature value suitable to a matrix H using the temperature value measured by a temperature sensor. As a similar method, a matrix value for the intensity of current has only to be selected based on the current I measured after a temperature value is determined. For example, the aforementioned experiments correspond to a case where the matrices were measured using the amounts of current 1 A, 10 A, 25 A, and 50 A at temperatures of −40 degrees, −20 degrees, 0 degrees, 20 degrees, 40 degrees, 60 degrees, and 80 degrees with respect to the busbar 10 of 50 A standard, which is represented by H(T, C) for convenience sake. In this case, T is assumed to be a temperature, and C is assumed to be the amount of current. With respect to such a combination, the matrix H has a total number of 4 (the number of types of the amounts of current)*7(the number of types of temperature) types=28 types. If a temperature when the busbar 10 operates is about 40 degrees, the amount of current I'$_0$ is 10 A, and the amount of current I'$_1$ is 20 A, H(T, C) results in H(T=40 degrees, C=10 A) because the first row of the matrix H is an interference coefficient attributable to I'$_0$, and H(T, C) results in H(T=40 degrees, C=20 A) because the second row is an interference coefficient attributable to I'$_1$. If a temperature or a current value is not included in the table, H(T, C) may be calculated using an interpolation method.

Mathematical modeling is possible because an influence attributable to the distance and the amount of current that belong to the interference coefficients corresponds to a physical phenomenon. The interference coefficient matrix may be modeled based on the distance from the busbar and the amount of current measured in the busbar because a magnetic flux density B is in inverse proportion to the distance and is proportional to the amount of current.

That is, the interference coefficient matrix may be modeled and generated according to the following equation.

$$B = \frac{u_0 I}{4\Pi} \int \frac{dl X r^\wedge}{r^2} = \frac{u_0 I}{4\Pi} \cdot \frac{I}{r} \qquad \text{Equation 2}$$

(In this case, B=a magnetic flux density, $u_0$=permeability in vacuum, I=current, r=the distance from a conductor (the distance from the busbar or an adjacent busbar), dl=the curvilinear integral of a current direction, and $r^\wedge$=a unit vector in a direction r)

In summary, each element $h_{n,m}$ of the matrix H may be considered to be a function, such as each distance, current, shielding, or temperature. The element may be determined by performing measurement for each temperature, for each current, and for each distance, performing measurement in the state in which the busbar 10 has been installed, or performing modeling.

The interference coefficient derivation unit 320 may derive the interference coefficient of a corresponding busbar 10 using an interference coefficient matrix or an interpolation method. The correction current value calculation unit 330 may derive a corrected current value using a corresponding interference coefficient.

Furthermore, the interference correction memory 340 may store the interference coefficient matrix generated by the interference coefficient matrix generation unit and an interference correction equation for deriving the corrected current value using an interference coefficient. The interference coefficient derivation unit 320 and the correction current value calculation unit 330 may read a value necessary to correct the interference of a measured signal from the interference correction memory 340 and calculate the corrected current value.

Meanwhile, an actual interference coefficient having sufficient accuracy may be obtained by taking into consideration only interference with a secondarily adjacent busbar because interference in the busbar 10 is rapidly attenuated according to the distance. Accordingly, the actual interference coefficient may be represented very simply as in the following equation and the matrix.

$$I_n = h_{n-2,n} * I'_{n-2} + h_{n-1,n} * I'_{n-1} + h_{n,n} * I'_n + h_{n+1,n} * I'_{n+1} + h_{n+2,n} * I'_{n+2}.$$

Equation 3

$$\begin{bmatrix} I_0 \\ I_1 \\ I_2 \\ I_3 \\ \vdots \\ I_n \\ \vdots \\ \vdots \end{bmatrix} = \begin{bmatrix} h_{0,0} & h_{1,0} & h_{2,0} & 0 & 0 & \cdots & 0 \\ h_{0,1} & h_{1,1} & h_{2,1} & h_{3,1} & 0 & \cdots & 0 \\ h_{0,2} & h_{1,2} & h_{2,2} & h_{3,2} & h_{4,2} & \cdots & 0 \\ 0 & h_{1,3} & h_{2,3} & h_{3,3} & h_{4,3} & \cdots & 0 \\ \vdots & \vdots & \vdots & \vdots & \vdots & & \vdots \\ 0 & \cdots & h_{n-2,n} & h_{n-1,n} & h_{n,n} & & \\ \vdots & \vdots & \vdots & \vdots & \vdots & & \vdots \\ \vdots & \vdots & \vdots & \vdots & \vdots & & \vdots \end{bmatrix} = \begin{bmatrix} I'_0 \\ I'_1 \\ I'_2 \\ I'_3 \\ \vdots \\ I'_n \\ \vdots \\ \vdots \end{bmatrix}$$

(In this case, I=current measured by the magnetic sensor module, $h_{n,m}$=the interference coefficient of current that flows into the $n^{th}$ busbar and that interferes with the $m^{th}$ busbar, I'=an actual current, and n=order of a busbar to be measured)

The above example illustrates an example in which the interference of a signal sampled on a time axis has been removed. If the interference of current remains constant for a short time, the amount of currents I' and I may be converted into complex numbers by taking a phase into consideration and calculated at once without calculating them for each current sampling value, thereby being capable of reducing a total computation load.

Figure 7:
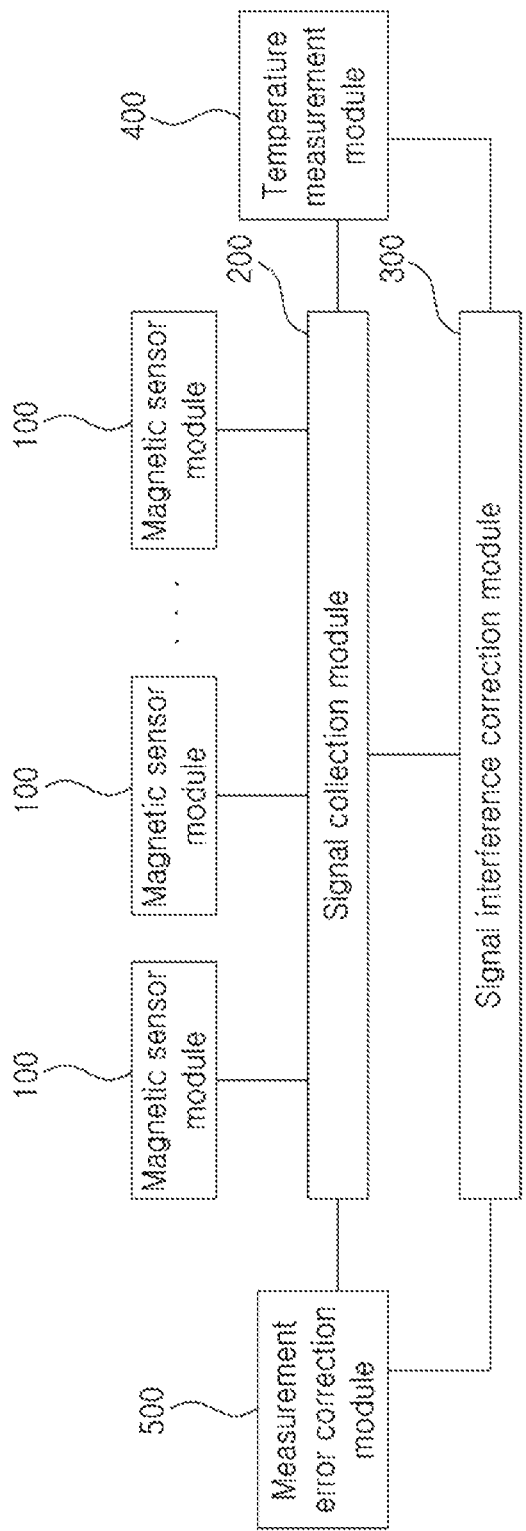
FIG. 7 is a diagram illustrating the configuration of an interference correction type single-point detection current sensor for multiple busbars in accordance with another embodiment of the present invention.

FIG. 7 is a diagram illustrating the configuration of an interference correction type single-point detection current sensor for multiple busbars in accordance with another embodiment of the present invention. As illustrated in FIG. 7, the interference correction type single-point detection current sensor for multiple busbars in accordance with another embodiment of the present invention may be configured to further include a temperature measurement module 400. A plurality of interference coefficient matrices may be generated in each predetermined unit within a predetermined temperature range and stored. The signal interference correction module 300 may derive a corrected current value using an interference coefficient matrix that complies with a temperature measured by the temperature measurement module 400.

Furthermore, the single-point detection current sensor may be configured to further include a measurement error correction module 500 for deriving a measurement error correction value for each sensor by calculating environment variables, including a temperature, the distance from the busbar, and the intensity of a magnetic flux, with respect to a measured signal output by the magnetic sensor module. The signal interference correction module 300 may derive a corrected current value based on a measurement error correction value derived by the measurement error correction module. Each of the magnetic sensor modules 100 may have an error attributable to environment variables, such as a temperature, the distance, and the intensity of a magnetic flux, and thus may derive a measurement error correction variable according to environment variables, such as a temperature and the distance, by comparing the measured amount of current, measured by each busbar not having interference, with the actual amount of current. Such a measurement error correction variable may be stored in separate memory and used.

The present invention described above may be modified or applied in various ways by those skilled in the art to which the present invention pertains, and the scope of a technical spirit according to the present invention should be determined by the following claims.

<Description of the Reference Numerals>

10: busbar
11: busbars to be measured
12: adjacent busbar
100: magnetic sensor module
101: adjacent magnetic sensor module
102: adjacent magnetic sensor module
200: signal collection module
300: signal interference correction module
310: interference coefficient matrix generation unit
320: interference coefficient derivation unit
330: correction current value calculation unit
340: interference correction memory
400: temperature measurement module
500: measurement error correction module

The invention claimed is:

1. An interference correction type single-point detection current sensor for multiple busbars, the single-point detection current sensor comprising:
  a plurality of magnetic sensor modules which are brought in insulation contact with or installed adjacent to a plurality of respective busbars, measure currents flowing into the busbars using magnetic sensors, and output the measured currents;
  a signal collection module which collects the measured signals output by the plurality of magnetic sensor modules; and
  a signal interference correction module which derives corrected current values from which interference has been removed by calculating amounts of interference between the plurality of busbars in the signals collected by the signal collection module.

2. The single-point detection current sensor of claim 1, wherein the magnetic sensor module is configured to comprise:
  the magnetic sensor which is brought in insulation contact with or installed adjacent to the busbar and collects a magnetic field line generated by a current flowing into the busbar; and
  a signal analysis circuit which calculates back to information about a current that flows into the busbar by analyzing a signal collected by the magnetic sensor.

3. The single-point detection current sensor of claim 1, wherein the signal interference correction module is configured to comprise:
   an interference coefficient matrix generation unit which generates an interference coefficient matrix;
   an interference coefficient derivation unit which derives an interference coefficient of a corresponding busbar using the interference coefficient matrix or an interpolation method; and
   a correction current value calculation unit which derives the corrected current value using the derived corresponding interference coefficient.

4. The single-point detection current sensor of claim 3, wherein:
   the signal interference correction module further comprises interference correction memory which stores an interference correction equation for deriving the corrected current value using the interference coefficient matrix generated by the interference coefficient matrix generation unit and the interference coefficient, and
   the interference coefficient derivation unit and the correction current value calculation unit read a value necessary to correct interference of the measured signal from the interference correction memory and calculate the corrected current value.

5. The single-point detection current sensor of claim 3, wherein a plurality of the interference coefficient matrices is generated in each predetermined unit within a predetermined range of one or more variables selected from a group comprising a temperature, current, and measured location, and distance between the busbars.

6. The single-point detection current sensor of claim 3, wherein the interference coefficient matrix is modeled and generated according to an equation below, $$B = \frac{u_0 I}{4\Pi} \int \frac{dl \times r^\wedge}{r^2} = \frac{u_0 I}{4\Pi} \cdot \frac{1}{r} \quad \text{Equation}$$

(wherein B=a magnetic flux density, $u_0$=permeability in vacuum, I=current, r=a distance from a conductor (a distance from the busbar or an adjacent busbar), dl=a curvilinear integral of a current direction, and r^=a unit vector in a direction r).

7. The single-point detection current sensor of claim 1, further comprising a temperature measurement module,
   wherein a plurality of interference coefficient matrices is generated in each predetermined unit within a predetermined temperature range, and
   the signal interference correction module derives the corrected current value using the interference coefficient matrix that complies with a temperature measured by the temperature measurement module.

8. The single-point detection current sensor of claim 1, further comprising a measurement error correction module which derives a measurement error correction value of each sensor by calculating environment variables, comprising a temperature, distance from the busbar, and intensity of a magnetic flux in the measured signal output by the magnetic sensor module,
   wherein the signal interference correction module derives the corrected current value based on the measurement error correction value derived by the measurement error correction module.

* * * * *